US006617189B1

(12) United States Patent
Chen et al.

(10) Patent No.: US 6,617,189 B1
(45) Date of Patent: Sep. 9, 2003

(54) METHOD OF FABRICATING AN IMAGE SENSOR

(75) Inventors: Tze-Jing Chen, Tai-Nan (TW); Ching-Chung Chen, Taipei Hsien (TW); Tung-Hu Lin, I-Lan Hsien (TW); Chen-Bin Lin, Taipei (TW); Chi-Rong Lin, Chang-Hua Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/063,949

(22) Filed: May 28, 2002

(51) Int. Cl.7 .............................................. H01L 21/00
(52) U.S. Cl. ........................ 438/48; 438/70; 438/58; 438/59; 438/65; 257/233; 257/294
(58) Field of Search ....................... 438/65–70, 48, 438/73, 58–59; 257/292–294, 432, 233–231

(56) References Cited

U.S. PATENT DOCUMENTS 6,171,883 B1 * 1/2001 Fan et al. .................... 257/233
6,362,498 B2 * 3/2002 Abramovich ................ 257/215
6,369,417 B1 * 4/2002 Lee ............................. 257/292

* cited by examiner

Primary Examiner—Dong Le
(74) Attorney, Agent, or Firm—Winston Hsu

(57) ABSTRACT

A method of fabricating an image sensor on a semiconductor substrate including a sensor array region is introduced. First, an R/G/B color filter array (CFA) is formed on portions of the semiconductor substrate corresponding to the sensor array region. Then, a spacer layer is formed on the R/G/B CFA, and a plurality of U-lens is formed on the spacer layer corresponding to the R/G/B CFA. Afterwards, a buffer layer is coated to fill a space between the U-lens, and a low-temperature passivation layer is deposited on the buffer layer and the U-lens at a temperature of about 300° C. or less to prevent the R/G/B CFA from damage.

15 Claims, 7 Drawing Sheets

METHOD OF FABRICATING AN IMAGE SENSOR

BACKGROUND OF INVENTION

1. Field of the Invention

The present invention relates to a method of fabricating an image sensor, and more particularly, to a method of fabricating a complementary metal-oxide semiconductor (CMOS) image sensor.

2. Description of the Prior Art

Charge-coupled devices (CCDs) have been the mainstay of conventional imaging circuits for converting light into electrical signals. The applications of CCDs include monitors, transcription machines, and cameras. Although CCDs have many advantages, CCDs also suffer from high costs and the limitations imposed by their size. To overcome the weaknesses of CCDs and to reduce costs and dimensions, CMOS photodiode devices have been developed. Since a CMOS photodiode device can be produced using conventional techniques, both the cost and the size of the sensor can be reduced.

Whether an image sensor device is composed of CCD or CMOS photodiode, incident light striking the image sensor must be separated into combinations of light of different wavelengths in order to properly sense color images. The intensities of the different wavelengths of the light is received by sensor devices and is transformed into electrical signals which are used to determine the original color of the incident light. To accomplish this feat, a color filter array (CFA) must be formed on each photosensor device.

FIG. 1 through FIG. 3 are schematic diagrams in a conventional method of fabricating a CMOS image sensor 38 on a semiconductor substrate 10. The CMOS image sensor 38 comprises a P-well 12 and a sensor array region I positioned on the P-well 12. The sensor array region I comprises a plurality of photodiodes (not shown) positioned on the P-well 12 and a plurality of shallow trench isolations (STI) 14 formed in the P-well 12 surrounding the photodiode. Each photodiode comprises a CMOS transistor (not shown) electrically connected to a photosensor area 16. The STI 14 acts as a dielectric insulating material to prevent short-circuiting due to contact between the photosensor area 16 and other components.

First, a planarizing layer 18 is coated on the semiconductor substrate 10 and covers each photosensor area 16. Then, a plurality of metal barriers 20 is formed on the planarizing layer 18 in the sensor array region I of the semiconductor substrate 10. The metal barriers 20 are located above each STI 14 and are used to prevent scattering of incident light 39. A patterned metal layer is formed on the semiconductor substrate 10 outside the sensor array region I and is used as a bonding pad metal layer 22. Afterwards, a planarizing layer 24 is coated on the semiconductor substrate 10. Then a patterned photoresist layer (not shown) is formed on the planarizing layer 24 outside the sensor array region I to define a pattern of a bonding pad opening 26. Thereafter, an etching process is performed to form the bonding pad opening 26 down to the bonding pad metal layer 22.

A red color filter layer 28 is formed on the sensor array region I of the semiconductor substrate 10. The color filter layer is composed of a positive type photoresist containing a red dye in an amount of 10 to 50 wt % (dry weight). Then, a photo-etching process (PEP) is performed to form a red color filter array (CFA) 28 in the red color filter layer corresponding to the respective photodiode. To increase the effectiveness and reliability of the red CFA 28, an ultraviolet (UV) light-irradiation process and a heating process can be performed after the formation of the red CFA 28. The UV light used has a wavelength of about 320 nm or less, and a quantity of about 20 $J/cm_2$ or less. The heating process is best performed in an inert atmosphere, for example in nitrogen (N2), to suppress the oxidation of the photoresist material. The starting temperature of the heating process is between 60 and 140° C. Then, an average increasing temperature rate used in the heating process is 1.5° C./sec. The end temperature of the heating process is between 160 and 220° C. A green CFA 30 and a blue CFA 32 are formed by repeating the above-mentioned processes with dyes of different colors. Thus, an R/G/B CFA comprises a red CFA 28, a green CFA 30 and a blue CFA 32.

A spacer layer 34 is formed on the R/G/B CFA, and a polymer layer (not shown) composed of acrylate material is formed on the spacer layer 34. Further, an exposure, development, and annealing process is performed to form a plurality of U-lenses 36 in the polymer layer corresponding to the respective R/G/B CFA, and fabrication of the CMOS image sensor 38 is completed.

When incident light 39 entering the CMOS image sensor 38 is focused by the U-lens 36, it passes through the R/G/B CFA, which only transmits light of a specific wavelength. The incident light 39 is transferred to the corresponding photosensor area 16, which transforms the incident light 39 into electrical signals so as to obtain the original color of the incident light 39.

In a conventional CMOS image sensor 38, the U-lens 36, the spacer layer 34 and the R/G/B CFA are all made of photoresist materials with low-temperature flash points of around 300° C. or less. Therefore, a passivation layer cannot be formed on the U-lens 36 to protect the U-lens 36 and the R/G/B CFA from loose particles or other contamination sources. Other drawbacks of the conventional CMOS image sensor 38 are listed below:(1) Because the U-lens 36 and the R/G/B CFA are made of photoresist materials, the bonding pad has to be formed prior to the formation of the R/G/B CFA and the U-lenses 36. However, the R/G/B CFA development process will attack the bonding pad metal layer 22 and creates a risk of pitting. (2) Since the bonding pad is formed prior to the R/G/B CFA steps, a large trench on a scribe line will induce some color wave images on the CFA. (3) Dropped particles cannot be removed using a jet clean process because there is no passivation layer on the U-lens 36. This means that contamination during the manufacturing process requires that the whole U-lens 36 and the R/G/B CFA be removed and recreated. (4) The conventional technique utilizes the high curvature U-lens 36 to adjust the focal plane of the incident light 39 passing through and focused by the U-lens 36. As the process size in semiconductor manufacturing decreases, formation of the high curvature U-lens 36 becomes increasingly difficult. (5) A space exists between each U-lens 36, so that scattered light easily enters the neighboring photosensor area 16, resulting in cross talk effects. This increases the noise levels of the CMOS transistor image sensor 38 and reduces sensitivity.

SUMMARY OF INVENTION

It is therefore an objective of the claimed invention to provide a method of fabricating an image sensor having a passivation layer.

It is another objective of the claimed invention to provide a method of fabricating an image sensor in which the focal plane of incident light can be adjusted.

The claimed invention involves providing a semiconductor substrate comprising a sensor array region. First, a planarizing layer is formed on the semiconductor substrate. An R/G/B color filter array (CFA) is formed on portions of the planarizing layer corresponding to the sensor array region, and a spacer layer is formed on the R/G/B CFA. A plurality of U-lenses is formed on the spacer layer corresponding to the R/G/B CFA, with a space between each U-lens. Finally, a buffer layer is applied to fill the space between the U-lens, and a low-temperature passivation layer is deposited on the buffer layer and the U-lens.

The present invention utilizes the buffer layer and the low-temperature passivation layer sequentially formed on the U-lens to prevent damage to the U-lens. Because the buffer layer has a predetermined index of refraction (IR), an optical path of incident light can be changed by adjusting the IR of the buffer layer. Simultaneously, cross talk effects, caused when incident light is refracted in a way that causes it to strike an adjacent photosensor, can be prevented, and quantum efficiency (QE) can be increased. The low-temperature passivation layer is formed at a temperature of about 300° C. or less. Because this is below the flash point of the U-lens and the CFA, they are not are not effected by this process. The passivation layer prevents the contamination of the U-lens by particles or other sources, and increases product reliability.

These and other objectives of the present invention will no doubt become obvious to those of ordinary skill in the art after reading the following detailed description of the preferred embodiment that is illustrated in the multiple figures and drawings.

DETAILED DESCRIPTION

This description utilizes a CMOS image sensor as an example to set forth the features in the present invention, but it is clearly recognized that the present invention may be applied equally well to a charge-injection device (CID) image sensor and a charge-coupled device (CCD) image sensor.

Figure 1:
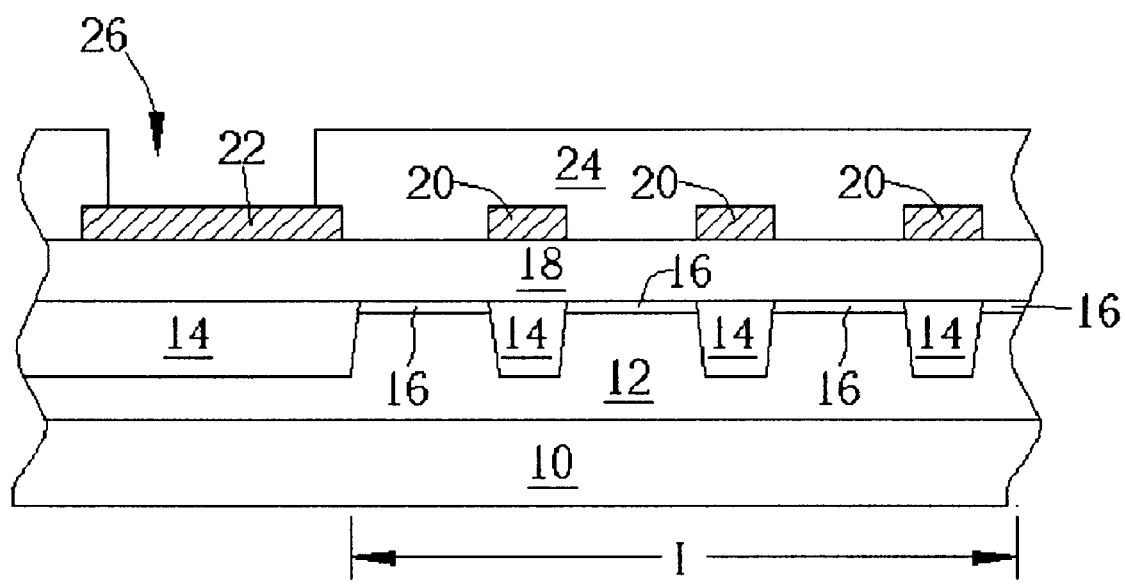
FIG. 1 through FIG. 3 are schematic diagrams in a conventional method of fabricating an image sensor.
Figure 2:
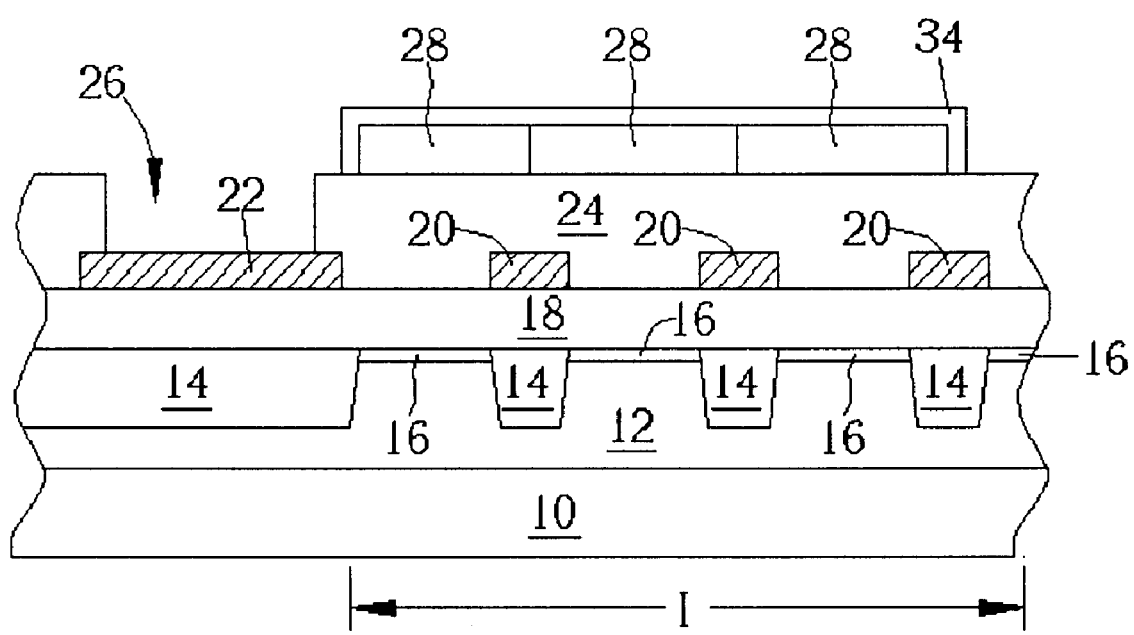
Figure 3:
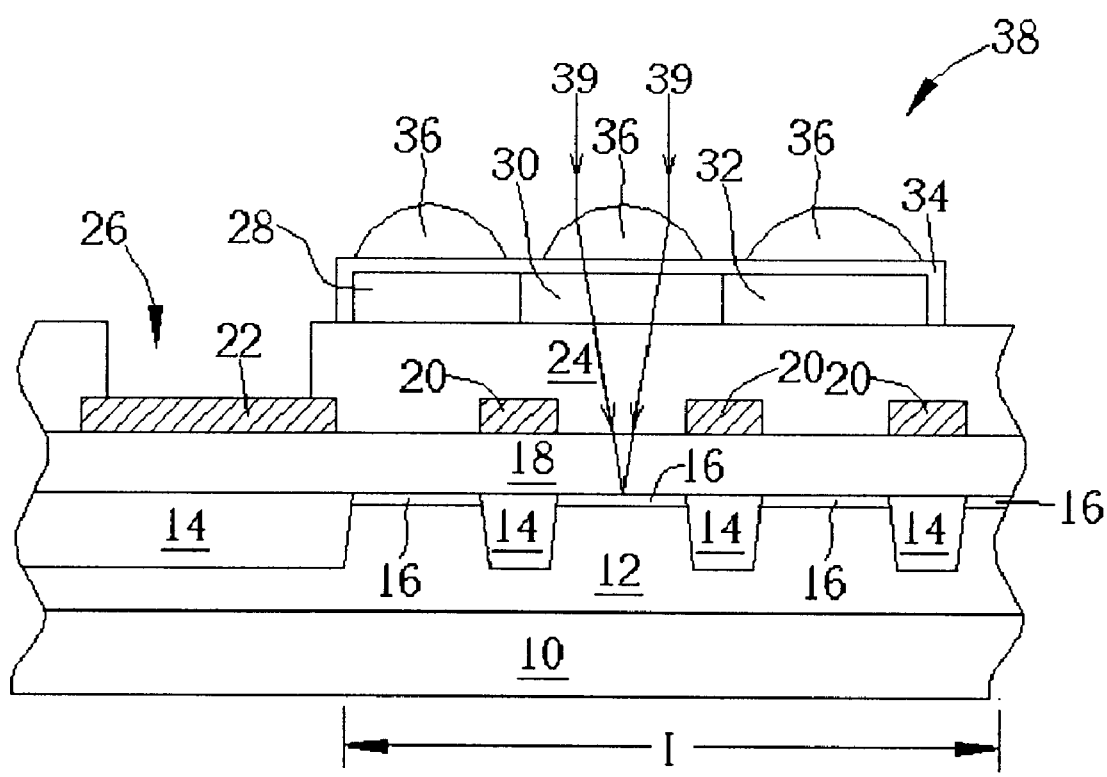
Figure 4:
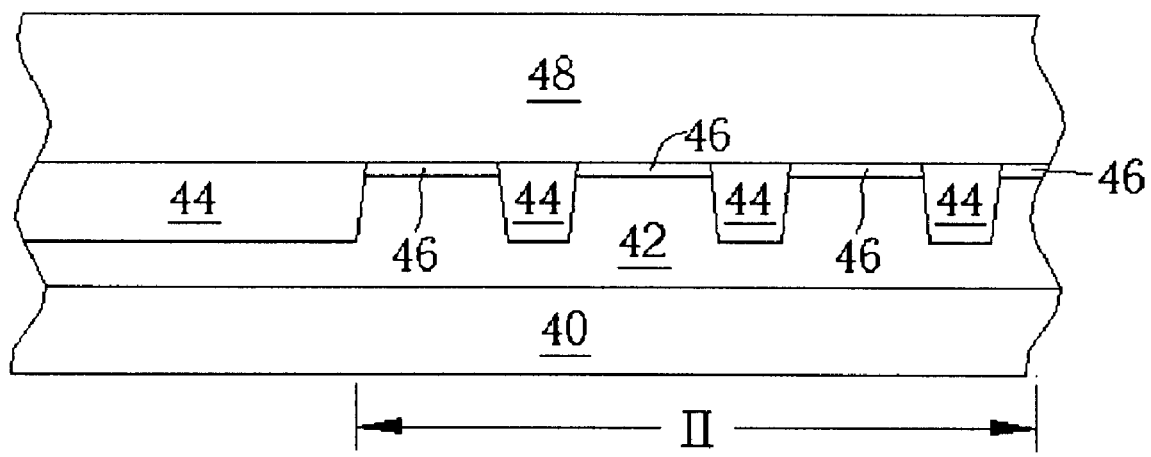
FIG. 4 through FIG. 7 are schematic diagrams of a method of fabricating an image sensor according to the present invention.

FIG. 4 through FIG. 7 are schematic diagrams of a method of fabricating a CMOS image sensor 74 on a semiconductor substrate 40 according to the present invention. As illustrated in FIG. 4, the semiconductor substrate 40 comprises a P-well 42 and a sensor array region 11 positioned on the P-well 42. The sensor array region 11 comprises a plurality of photodiodes (not shown) positioned on the P-well 42 and a plurality of shallow trench isolations (STI) 44 formed in the semiconductor substrate 40 surrounding the photodiode. Each photodiode comprises a CMOS transistor (not shown) electrically connected to a photosensor area 46. First, a first planarizing layer 48, composed of silicon-rich oxide (SRO) or spin-on glass (SOG), is formed on the semiconductor substrate 40 to cover each photodiode.

Figure 5:
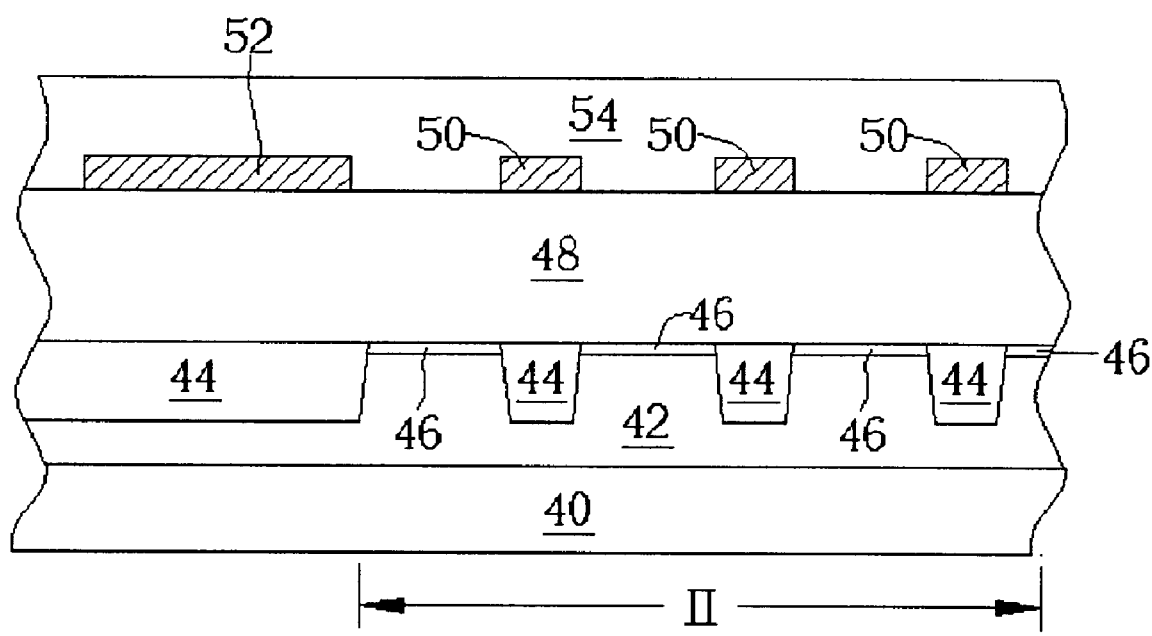

As illustrated in FIG. 5, a plurality of metal barriers 50 is formed on the first planarizing layer 48 in the sensor array region 11 of the semiconductor substrate 40. These metal barriers 50 are located above each STI 44 and are used to prevent scattering of incident light. A patterned metal layer is formed on the semiconductor substrate 40 outside the sensor array region 11 corresponding to the respective STI 44 and used as a bonding pad metal layer 52. Then, a passivation layer (not shown), composed of silicon-oxy-nitride (SiON) is formed on the first planarizing layer 48, the metal barriers 50 and the bonding padmetal layer 52. Thereafter, a second planarizing layer 54 is coated on the passivation layer.

Figure 6:
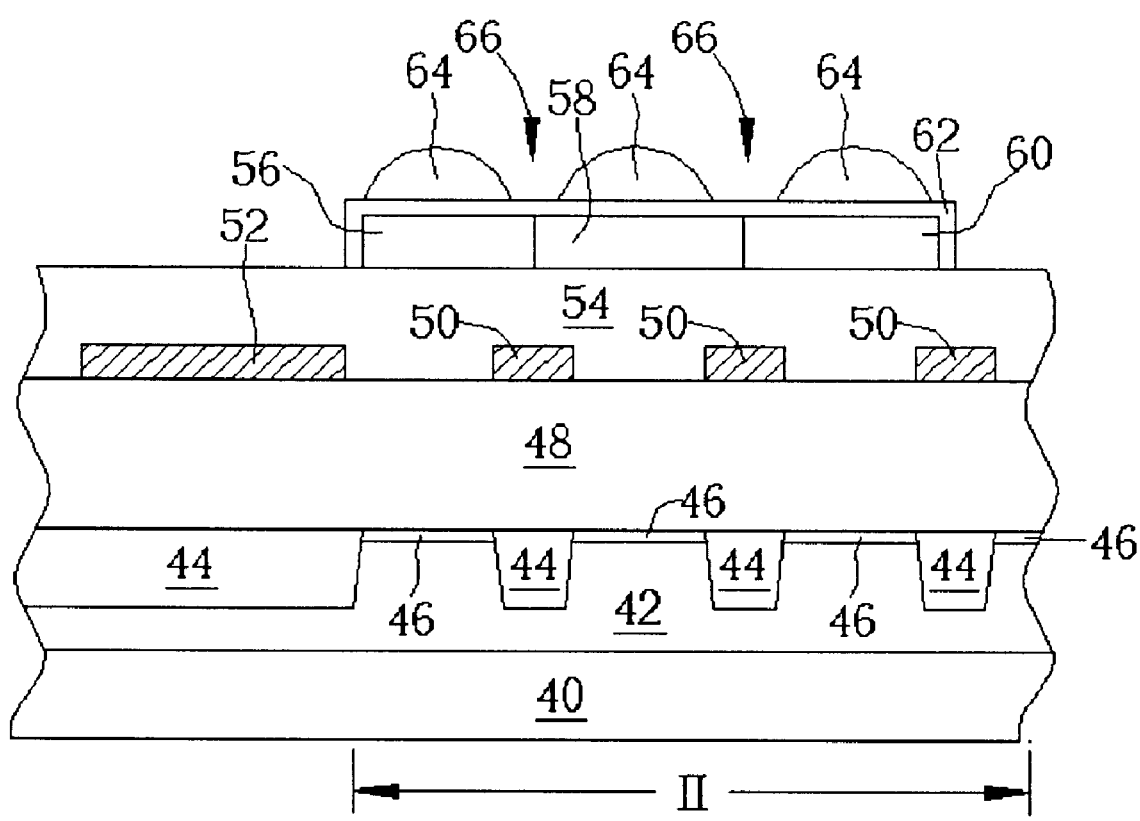

As illustrated in FIG. 6, an R/G/B CFA 56,58, 60 is formed on the planarizing layer 54 using the prior art method. Then, a spacer layer 62 is formed on the R/G/B CFA 56,58, 60. Next, a plurality of U-lenses 64 are formed on the spacer layer 62 corresponding to the respective R/G/B CFA 56,58, 60, so that a space 66 is formed between each U-lens 64.

Figure 7:
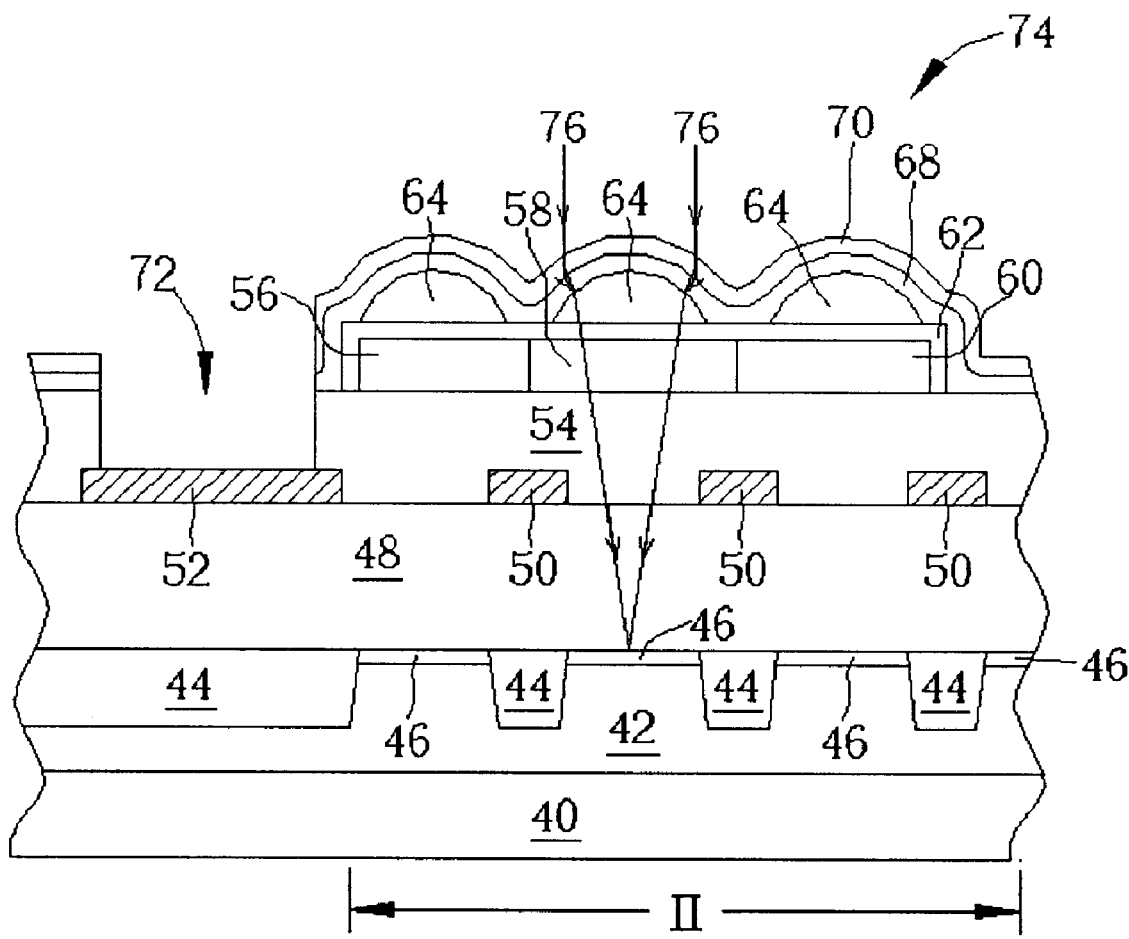

As illustrated in FIG. 7, a buffer layer 68, composed of a low-temperature spin-on coating (SOC) material, is applied to the semiconductor substrate 40 to fill the space 66 between each U-lens 64. The buffer layer 68 has a predetermined index of refraction (IR) to adjust a focal plane of incident light 76 passing through the U-lens 64. Further, a plasma-enhanced chemical vapor deposition (PECVD) process is performed to deposit a low-temperature passivation layer 70 on the buffer layer 68 and the U-lens 64 at a temperature of 300° C. or less. The low-temperature passivation layer is a TEOS CVD layer and has a thickness of 1000 angstroms (Å). Finally, a patterned photoresist layer (not shown) is formed on the low-temperature passivation layer 70 outside the sensor array region 11 to define a pattern of a bonding pad opening 72. Then, an etching process is performed to form the bonding pad opening 72 connecting with the bonding pad metal layer 52 to complete the CMOS image sensor 74.

Incident light 76 entering the CMOS image sensor 74 first passes through the low-temperature passivation layer 70 and the buffer layer 68. Due to theIR of the buffer layer 68, an optical path of the incident light 76 is changed according to a refraction rule ($n_1 \sin\theta_1 = n_2 \sin\theta_2$, where $n_1$ and $n_2$ are indices of refraction, $\theta_1$ is an angle of incidence, $\theta_2$ is an angle of reflection) by adjusting the RI. The incident light 76 is then focused by the U-lens 64 and passes through the respective R/G/B CFA, which only transmits light of a specific wavelength. Then, the incident light 76 is transferred to the corresponding photosensor area 46. The incident light 76 is received by the corresponding photosensor area 46 and is transformed into electrical signals so as to obtain the original color of the incident light 76.

Simply put, the present invention utilizes the buffer layer 68 and the low-temperature passivation layer 70 to prevent damage to the U-lens 64. Because the buffer layer 68 has a predetermined index of refraction (IR), an optical path of incident light can be changed by adjusting the IR of the buffer layer 68. Simultaneously, cross talk effects, caused when incident light is refracted in a way that causes it to strike an adjacent photosensor 46, is prevented, and quantum efficiency (QE) is increased. The low-temperature passivation layer 70 is formed at a temperature of about 300° C. or less. Because this is below the flash point of the U-lens 64 and the R/G/B CFA 56, 58, 60, they are notare not effected by this process. The passivation layer 70 prevents the contamination of the U-lens 64 by particles or other sources, and increases product reliability.

In contrast to the conventional method, the image sensor 74 produced by the present invention has the following advantages: (1) The buffer layer 68 and the low-temperature passivation layer 70 on top of the U-lens 64 are used to prevent the U-lens 64 from particle or other contamination sources. (2) Since the bonding pad opening 72 is formed after the formation of the U-lens 64, the R/G/B CFA 56, 58, 60 development process will not attack the bonding pad metal layer 52. (3) Since the large trench on scribe line is formed after the formation of the U-lens 64, no color wave issue will be involved. (4) Since the low-temperature passivation layer 70 is on top of the U-lens 64, dropped particles can be removed by using a jet clean process, and the U-lens 64 and the R/G/B CFA 56, 58, 60 do not have to be removed and recreated in the case of a contamination. (5) The buffer layer 68 between each U-lens 64 can prevent temperature induced peeling of the U-lens 64. (6) Because the buffer layer 68 has a predetermined IR, the optical path of incident light can be changed and the focal plane of incident light passing through the U-lens can be adjusted by using buffer layer with a different IR, making this method suitable for high integration semiconductor processes. (7) The buffer layer 68 fills in the spaces 66 between each U-lens 64, which prevents crosstalk, reduces noise, and increases the overall sensitivity of the CMOS image sensor 74.

Those skilled in the art will readily observe that numerous modification and alterations of the device may be made while retaining the teachings of the invention. Accordingly, the above disclosure should be construed as a limited only by the metes and bounds of the appended claims.

What is claimed is:

1. A method of fabricating an image sensor on a semiconductor substrate comprising a sensor array region, the method comprising:

forming a planarizing layer on the semiconductor substrate;

forming an R/G/B color filter array (CFA) on a portion of the planarizing layer corresponding to the sensor array region;

forming a spacer layer on the R/G/B CFA;

forming a plurality of U-lenses on the spacer layer above the R/G/B CFA with a space positioned between each adjacent U-lens;

coating the image sensor with a buffer layer to fill the space between adjacent U-lens;

depositing a passivation layer on the buffer layer and the U-lenses; and forming a bonding pad opening over the semiconductor substrate outside the sensor array region.

2. The method of claim 1 wherein the image sensor is a CMOS transistor image sensor.

3. The method of claim 1 wherein the sensor array region comprises a plurality of photodiodes formed in the sensor array region and a plurality of insulators positioned in the semiconductor substrate between the photodiodes.

4. The method of claim 1 wherein the buffer layer is made of a spin-on coating (SOC) material.

5. The method of claim 1 wherein the buffer layer has a predetermined index of refraction (IR) to adjust a focal plane generated from incident light passing through the U-lens.

6. The method of claim 1 wherein the passivation layer is formed by using a plasma enhanced chemical vapor deposition (PECVD) process.

7. The method of claim 6 wherein the plasma enhanced chemical vapor deposition process has a temperature of 300° C. or less.

8. The method of claim 1 wherein the passivation layer is a TEOS CVD layer.

9. The method of claim 8 wherein the passivation layer has a thickness of 1000 angstroms (Å).

10. A method of fabricating an image sensor of a CMOS, the method comprising:

providing a semiconductor substrate comprising a photoelectric conversion region with a plurality of photodiodes and a plurality of insulators positioned between the photodiodes;

forming a first planarizing layer;

forming a patterned metal layer on the semiconductor substrate corresponding to the respective insulator and outside the photoelectric conversion region;

forming a second planarizing layer on the semiconductor substrate;

forming an R/G/B color filter array (CFA) on the second planarizing layer corresponding to the respective photodiode;

forming a spacer layer on the R/G/B CFA;

forming a plurality of U-lenses on the spacer layer corresponding to the respective R/G/B CFA with a space positioned between each adjacent U-lens;

coating with a buffer layer to fill the space between each adjacent U-lens, the buffer layer having a predetermined index of refraction (IR) to adjust a focus plane generated from incident light passing through the U-lens;

depositing a passivation layer on the buffer layer and the U-lens; and forming a bonding pad on the semiconductor substrate outside the photoelectric conversion region by the following steps:

forming a patterned photoresist layer on the passivation layer outside the photoelectric conversion region to define a pattern of the bonding pad; and performing an etching process to form an opening connecting the patterned metal layer.

11. The method of claim 10 wherein the buffer layer is made of a spin-on coating (SOC) material.

12. The method of claim 10 wherein the passivation layer is formed by using a plasma enhanced chemical vapor deposition (PECVD) process.

13. The method of claim 12 wherein the plasma enhanced chemical vapor deposition process has a temperature of 300° C. or less.

14. The method of claim 10 wherein the passivation layer is a TEOS CVD layer.

15. The method of claim 14 wherein the passivation layer has a thickness of 1000 angstroms (Å).

* * * * *